US007071717B2

(12) United States Patent
Hoke et al.

(10) Patent No.: US 7,071,717 B2
(45) Date of Patent: Jul. 4, 2006

(54) UNIVERSAL TEST FIXTURE

(75) Inventors: Charles D. Hoke, Menlo Park, CA (US); Ken A. Nishimura, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/975,140

(22) Filed: Oct. 28, 2004

(65) Prior Publication Data
US 2006/0097738 A1    May 11, 2006

(51) Int. Cl.
*G01R 31/02*    (2006.01)
(52) U.S. Cl. .................. 324/755; 324/754; 324/758
(58) Field of Classification Search ............ None
See application file for complete search history.

(56) References Cited

U.S. PATENT DOCUMENTS

| 3,370,232 | A |   | 2/1968 | Wickersham |
|---|---|---|---|---|
| 4,271,516 | A |   | 6/1981 | Smith |
| 5,432,460 | A | * | 7/1995 | Flecha et al. ............... 324/754 |
| 5,491,427 | A | * | 2/1996 | Ueno et al. ................. 324/754 |
| 5,493,230 | A |   | 2/1996 | Swart et al. |
| 5,570,027 | A | * | 10/1996 | Stans et al. ................. 324/523 |
| 5,781,021 | A | * | 7/1998 | Ilani ........................... 324/754 |
| 6,292,004 | B1 |   | 9/2001 | Kocher |
| 6,441,636 | B1 |   | 8/2002 | Prokopp |
| 6,469,531 | B1 |   | 10/2002 | Sayre et al. |
| 6,496,025 | B1 |   | 12/2002 | Stadelmayer et al. |
| 6,597,190 | B1 |   | 7/2003 | Chan et al. |
| 6,657,449 | B1 |   | 12/2003 | Song |
| 6,661,245 | B1 |   | 12/2003 | Reis et al. |
| 6,667,630 | B1 |   | 12/2003 | Abdulky |
| 6,677,776 | B1 | * | 1/2004 | Doherty et al. ............. 324/765 |

* cited by examiner

Primary Examiner—Minh N. Tang

(57) ABSTRACT

A universal fixture for testing a device, such as a bare printed circuit board, includes a plurality of addressable contact points. Each of the contact points includes a switch connected to a conductor capable of creating an electrical connection to the device. To obtain a measurement of a target on the device, two of the contact points on the universal fixture are selected based on the position of the target on the device relative to the contact points.

23 Claims, 6 Drawing Sheets

UNIVERSAL TEST FIXTURE

DESCRIPTION OF RELATED ART

Before a printed circuit board (PCB) is loaded with components, the testpads, vias, traces and plated through-holes on the bare PCB are tested for electrical connectivity and continuity. Typical measurements conducted by bare-board testers include shorts, opens and impedance or resistance. Most conventional bare-board testers fall into one of two categories, either a "bed of nails" tester or a "flying probe" tester.

A "bed of nails" tester is used on low resolution PCBs that have line and space widths of 250 µm or greater. The "bed of nails" tester utilizes a bare-board fixture containing a series of plastic sheets with holes drilled to permit passage of pins (nails). During testing, the PCB is placed in direct contact with the bare-board fixture. The pins on the fixture connect the various targets (e.g., testpads, vias, traces and through-holes) on the PCB to the internal electronics of the tester. Although, the "bed of nails" tester permits nearly simultaneous testing of all targets on a PCB, each unique PCB that is tested requires a different custom fixture.

As component sizes have shrunk, the density of pins in the test fixtures has increased. In addition, with decreasing component size, the design and fabrication of the test fixtures has become more complicated. Since the pins must match points on a predefined grid in the tester and also connect with points on the PCB that are not necessarily aligned with the tester grid, some of the pins must be routed through the plastic sheets at angles. As a result, the cost of producing the test fixtures has significantly increased.

A "flying probe" tester is a universal tester that does not require a fixture. The "flying probe" tester uses a small number of probes that are sequentially positioned over numerous test points on the PCB. Although the "flying probe" tester permits testing of high resolution PCBs, the serial approach of testing targets on a PCB reduces the throughput of the tester. Thus, the "flying probe" tester is significantly slower than the "bed of nails" tester.

SUMMARY IN ACCORDANCE WITH THE INVENTION

In accordance with the invention, a universal fixture for testing an electronic device, such as a bare printed circuit board (PCB), is provided that is capable of testing PCBs at a high rate of speed. The universal fixture includes a plurality of addressable contact points. Each of the contact points includes a switch connected to a conductor capable of creating an electrical connection to the device. To obtain a measurement of a target on the device, two of the contact points on the universal fixture are selected based on the position of the target on the device relative to the contact points.

BRIEF DESCRIPTION OF THE DRAWINGS

Furthermore, the invention provides embodiments with other features and advantages in addition to or in lieu of those discussed above. Many of these features and advantages are apparent from the description below with reference to the following drawings.

DETAILED DESCRIPTION OF EXEMPLARY EMBODIMENTS

Embodiments in accordance with the invention provide a universal fixture, testing system and a method for testing electronic devices, such as bare printed circuit boards (PCBs). The universal fixture is capable of testing PCBs at rates of speed greater than those achievable by traditional "flying probe" testers.

Figure 1:
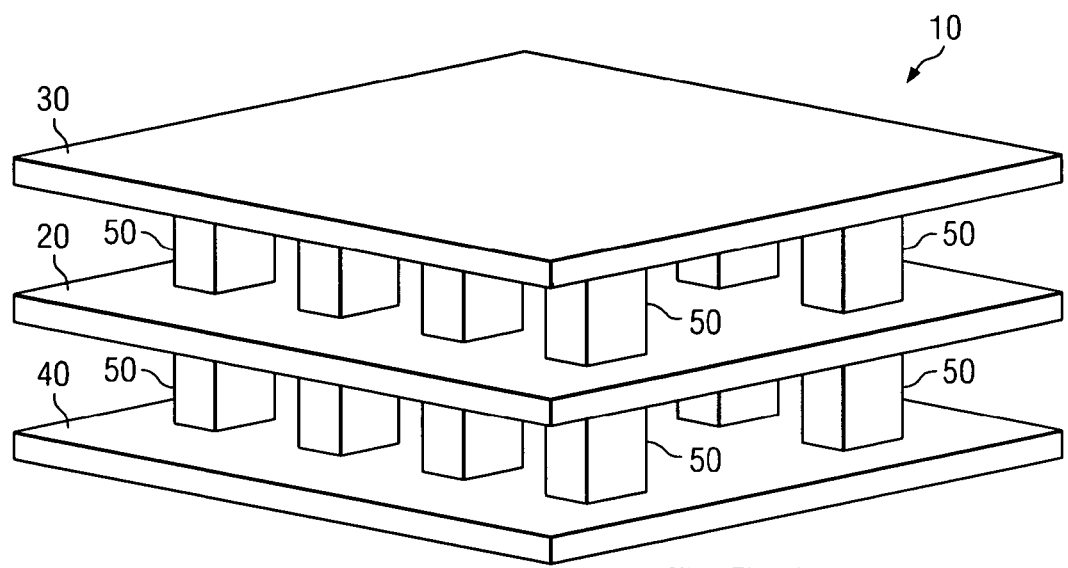
FIG. 1 is a top perspective view of a testing assembly including universal fixtures for testing an electronic device according to an exemplary embodiment in accordance with the invention.

FIG. 1 is a top perspective view of a testing assembly including universal fixtures for testing an electronic device according to an exemplary embodiment in accordance with the invention. The testing assembly is generally designated by reference number 10 and includes first universal fixture 30 and second universal fixture 40. An electronic device 20, such as a bare PCB, is sandwiched between first universal fixture 30 and second universal fixture 40. First universal fixture 30 is placed in direct contact with one side of PCB 20, while second universal fixture 40 is placed in direct contact with the other side of PCB 20.

Each universal fixture 30 and 40 includes a plurality of randomly addressable contact points 50 arranged on a two-dimensional grid pattern for creating electrical connections to targets on PCB 20. For example, targets can include testpads, vias, traces and through-holes on PCB 20. Contact points 50 are illustrated schematically in FIG. 1 as arranged in an orthogonal array of uniformly spaced-apart rows and columns of contact points 50. Contact points 50 include conductors or metal wires that protrude outward from the substrate containing the array towards electronic device 20. The density of contact points 50 is selected to ensure that each target on PCB 20 is capable of being contacted by at least two contact points 50 on one of first universal fixture 30 or second universal fixture 40. For example, in one embodiment, the center-to-center spacing between contact points 50 on each universal fixture 30 and 40 is less than or equal to 10 µm pitch.

When first universal fixture 30 and second universal fixture 40 are in direct contact with PCB 20, each target on PCB 20 is tested by selecting two contact points 50 that are best aligned with test points on the target. An electrical signal is applied to the test points from selected contact points 50 to connect the target on PCB 20 to test equipment (not shown) external to testing assembly 10 in order to test the electrical connection state of the target on PCB 20. For example, test equipment can include any electronic equipment needed to run or monitor the test, such as a computer and peripherals, a digital voltmeter, a current source, a digital logic analyzer, oscilloscopes, a network analyzer, cameras, pneumatic controls or other such test equipment.

Figure 2:
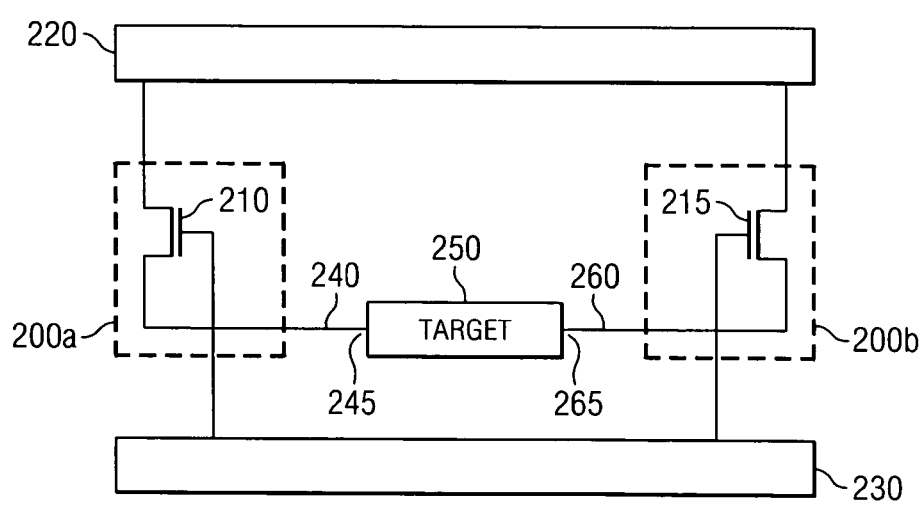
FIG. 2 is a schematic that illustrates one configuration of contact points of a universal fixture according to an exemplary embodiment in accordance with the invention.

FIG. 2 is a schematic that illustrates one configuration of contact points of a universal fixture according to an exemplary embodiment in accordance with the invention. Contact points 200*a* and 200*b* represent selected contact points in a universal fixture for testing target 250. Contact points 200*a* and 200*b* can be implemented in universal fixture 30 or 40 in FIG. 1 as contact points 50. Contact point 200*a* includes switch 210 and conductor 240. Switch 210 is connected to conductor 240, which is in contact with test point 245 on target 250. Contact point 200*b* includes switch 215 and conductor 260. Switch 215 is connected to conductor 260, which is in contact with test point 265 on target 250. Conductors 240 and 260 are pins, metal wires or probes configured to create an electrical connection to target 250. In one embodiment, switches 210 and 215 are thin film transistors.

Contact points 200*a* and 200*b* are selected by gate selector 230 and data selector 220. The gates of switches 210 and 215 are connected to gate selector 230 while the sources of switches 210 and 215 are connected to data selector 220. Gate selector 230 and data selector 220 each include additional switches (not shown) for connecting contact points 200*a* and 200*b* to external test electronics. For example, gate selector 230 controls the gates of switches 210 and 215 to turn on or turn off switches 210 and 215. Data selector 220 can connect contact points 200*a* and 200*b* to a current source in order to source a known current through target 250, and to a voltmeter to measure the voltage across target 250 when gate selector 230 places switches 210 and 215 in a first or "on" state.

Figure 3:
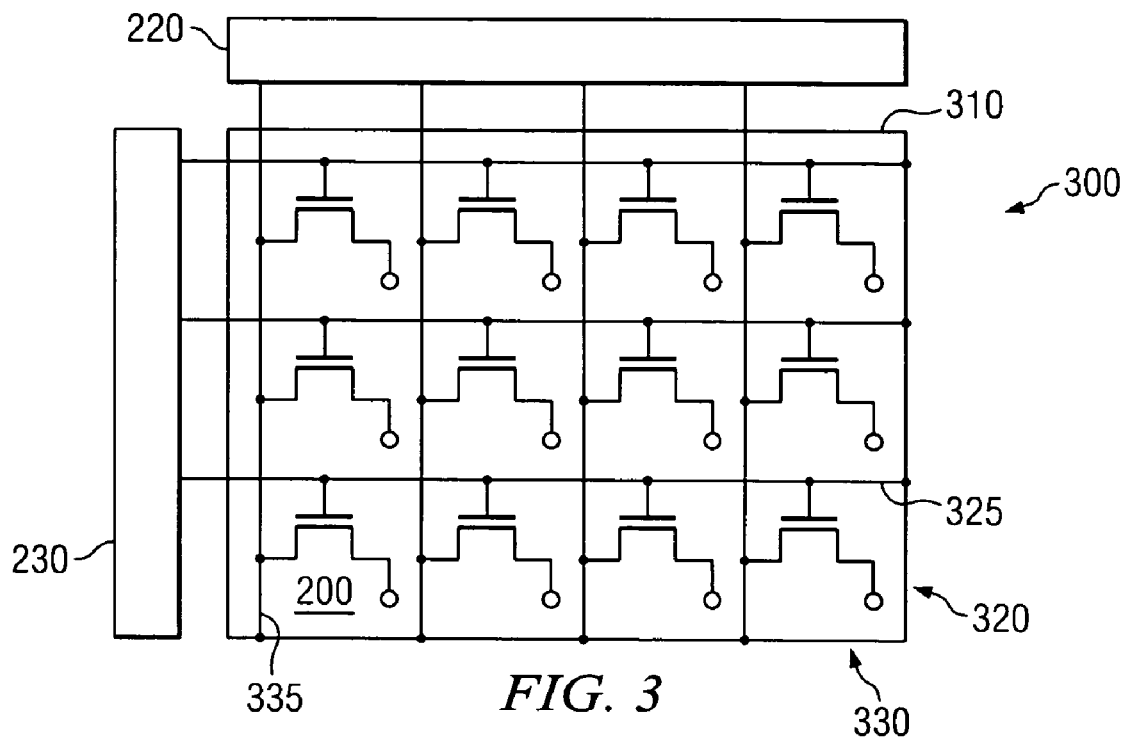
FIG. 3 is a schematic that illustrates a universal fixture including an array of contact points configured as shown in FIG. 2.

FIG. 3 is a schematic that illustrates a universal fixture 300 including an array 310 of contact points 200 configured as shown in FIG. 2. Universal fixture 300 can be implemented into test assembly 10 in FIG. 1 as universal fixture 30 or 40. Contact points 200 within array 310 are arranged in rows 320 and columns 330. Each row 320 is connected to scan selector 230 via lines 325. Each column 330 is connected to data selector 220 via lines 335. To select contact point 200, scan selector 230 transmits an electronic signal on line 325 connected to contact point 200 and data selector 220 transmits an electronic signal on line 335 connected to contact point 200.

Referring again to FIG. 2, scan selector 230 and data selector 220 select two contact points 200*a* and 200*b* to conduct a measurement of a target 250 on a device under test, such as a bare PCB. A typical measurement for a bare PCB is to measure the resistance of a trace (target 250) on the bare PCB to determine the electrical connectivity of the trace.

Figure 4A:
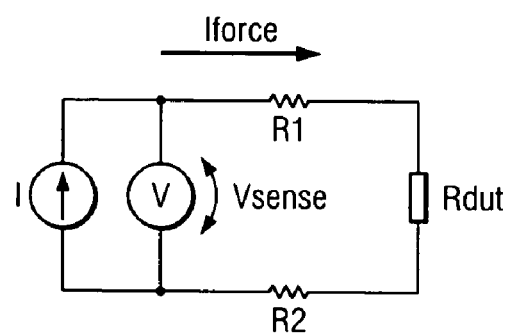
FIG. 4A is a schematic that illustrates a two-point measurement circuit.

FIG. 4A is a schematic that illustrates a two-point measurement circuit, similar to the measurement circuit shown in FIG. 2, that can be used to measure the resistance of a trace on a PCB. As shown in FIG. 4A, in order to measure the resistance of a DUT Rdut, a current source I sources and flows a known current Iforce through the unknown resistance Rdut of the DUT. The voltage Vsense that develops across the DUT resistance Rdut is measured by a voltmeter V, and the DUT resistance Rdut is determined by dividing the measured voltage Vsense by the sourced current Iforce.

However, as shown in FIG. 4A, the voltage is measured not only across the DUT resistance Rdut, but also across the contact resistance R1 and R2. For example, using the example shown in FIG. 2, switch 210 and conductor 240 add resistance R1, while switch 215 and conductor 260 add resistance R2. When the resistance R1 and R2 of the switches 210 and 215 and conductors 240 and 260 is large in comparison to the DUT (e.g., trace) resistance Rdut, it is difficult to obtain an accurate measurement of Rdut using the two-point measurement circuit shown in FIG. 4A.

Figure 4B:
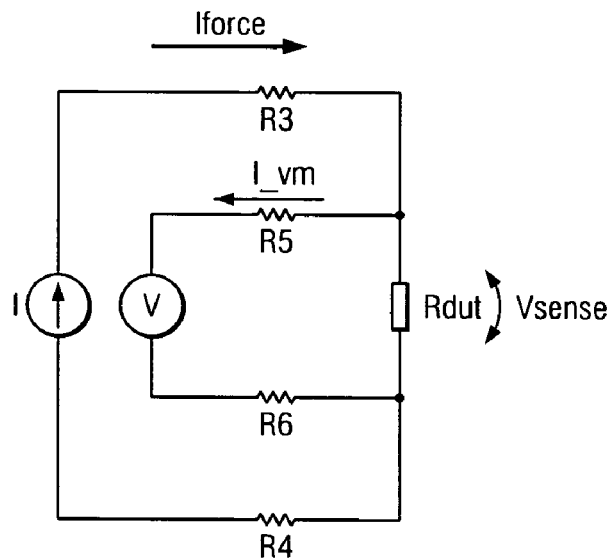
FIG. 4B is a schematic that illustrates a four-point measurement circuit.

Therefore, as shown in FIG. 4B, to improve the accuracy of the Rdut measurement, a four-point measurement circuit can be used. In FIG. 4B, the current source I and voltmeter V are both separately connected to the DUT resistance Rdut. Thus, the known current Iforce is sourced through the DUT resistance Rdut, as in FIG. 4A. However, the voltage drop across the DUT resistance Rdut is measured after the contact resistance R3 and R4. The high impedance of the digital voltmeter minimizes the current flow through the voltmeter. Thus, since there is no voltage drop across the contact resistance R5 and R6, only the DUT resistance Rdut is measured. As a result, the DUT resistance Rdut is equal to the ratio of the voltage registering on the digital voltmeter Vsense to the known current Iforce.

Figure 5:
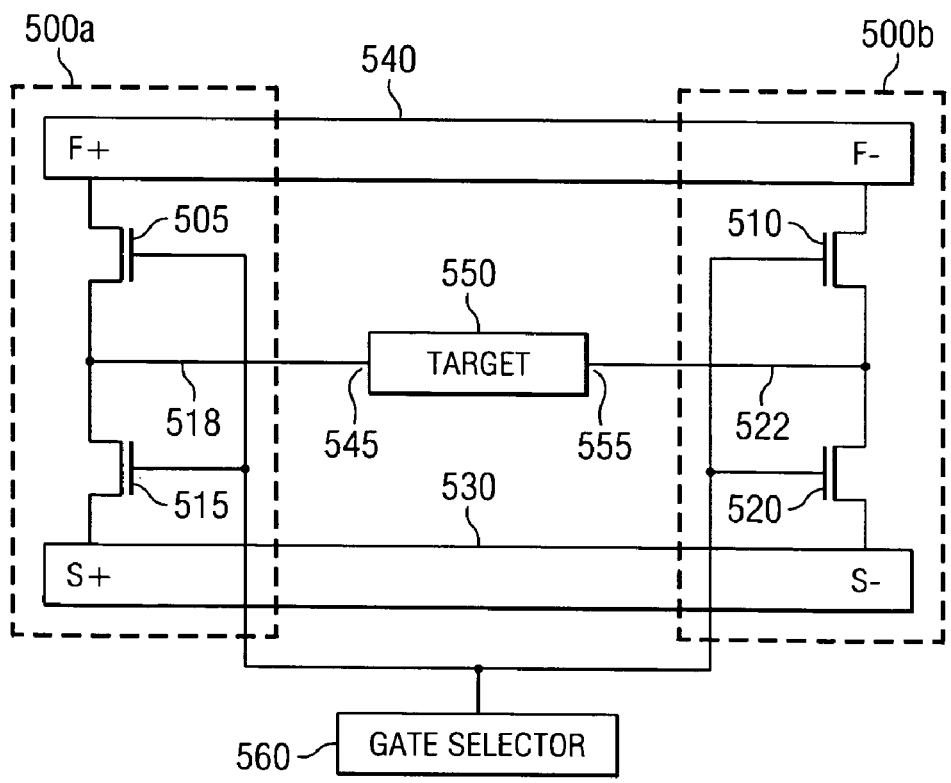
FIG. 5 is a schematic that illustrates another configuration of contact points a universal fixture according to another exemplary embodiment in accordance with the invention.

FIG. 5 is a schematic that illustrates another configuration of contact points in a universal fixture according to another exemplary embodiment in accordance with the invention. The contact point configuration shown in FIG. 5 uses a four-point measurement circuit similar to the circuit shown in FIG. 4B. Contact points 500*a* and 500*b* represent selected contact points in a universal fixture for testing target 550. Contact points 500*a* and 500*b* can be implemented in universal fixture 30 or 40 in FIG. 1 as contact points 50.

Contact point 500*a* includes switch 505, switch 515 and conductor 518. Switches 505 and 515 are each separately connected to conductor 518, which is in contact with test point 545 on target 550. Contact point 500*b* includes switch 510, switch 520 and conductor 522. Switches 510 and 520 are each separately connected to conductor 522, which is in contact with test point 555 on target 550. Conductors 518 and 522 are pins, metal wires or probes configured to create an electrical connection to target 550. In one embodiment, switches 505, 510, 515 and 520 are thin film transistors.

Contact points 500*a* and 500*b* are selected by force selector 540, sense selector 530 and gate selector 560 that are configured to place switches 505, 510, 515 and 520 in a first or "on" state. The gates of switches 505, 510, 515 and 520 are connected to gate selector 560, the sources of switches 505 and 510 are connected to force selector 540 and the drains of switches 515 and 520 are connected to sense selector 530. The drains of switches 505 and 510 are connected to conductors 518 and 522, respectively, while the sources of switches 515 and 520 are connected to conductors 518 and 522, respectively.

Force selector 540, sense selector 530 and gate selector 560 each include additional switches (not shown) for connecting contact points 500*a* and 500*b* to external test electronics. For example, force selector 540 can connect contact points 500*a* and 500*b* to a current source via switches 505 and 510 to source a known current through target 550 and sense selector 530 can connect contact points 500*a* and 500*b* to a voltmeter via switches 515 and 520 to measure the voltage across target 550. The direction of current through target 550 is determined by the connections F+/F− established by force selector 540 to the current source. Similarly, the connections S+/S− to the voltmeter to properly measure the voltage drop across target 550 are determined by sense selector 530.

Figure 6A:
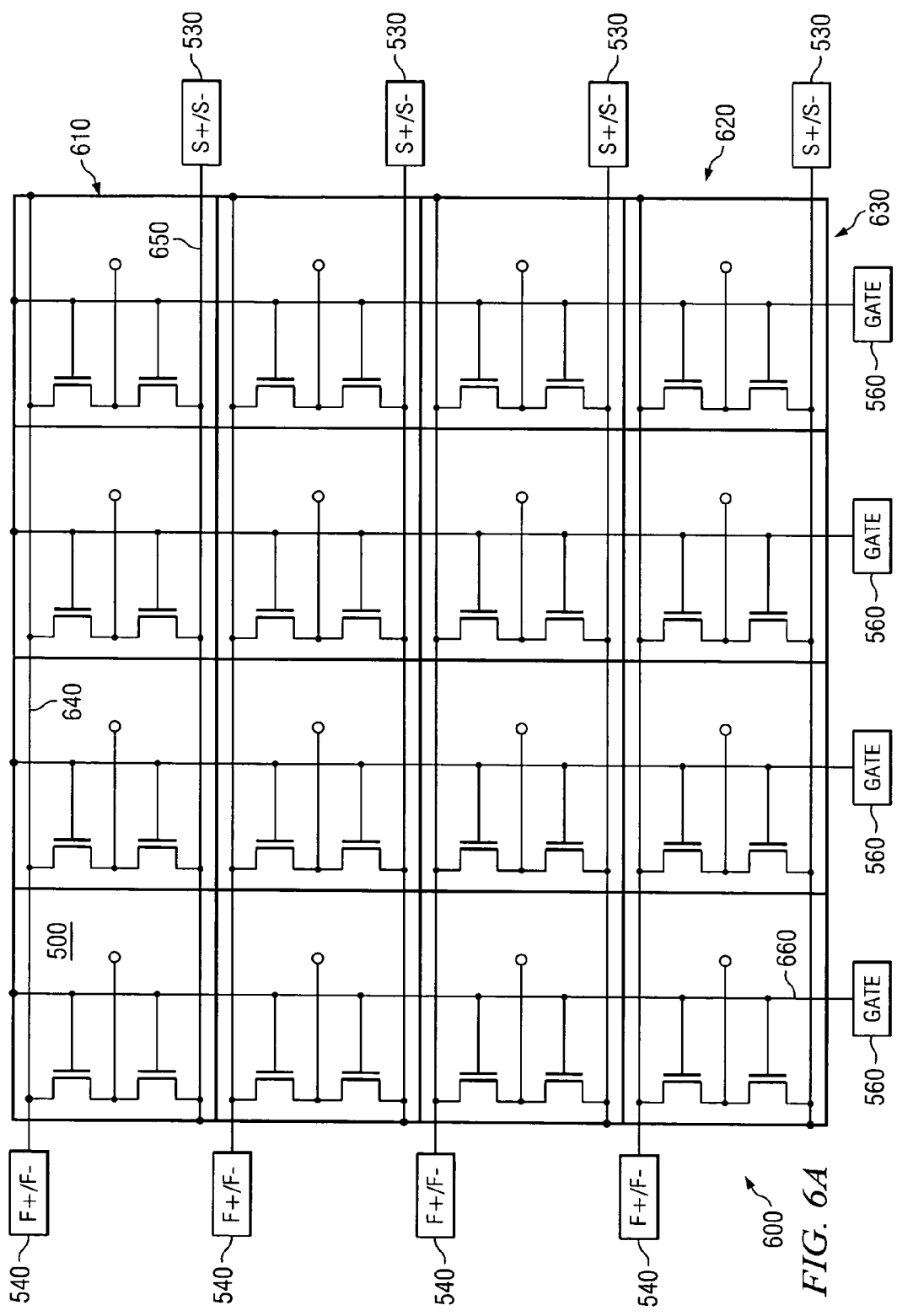
FIG. 6A is a schematic that illustrates a universal fixture including an array of contact points configured as shown in FIG. 5.

FIG. 6A is a schematic that illustrates a universal fixture 600 including an array 610 of contact points 500 configured as shown in FIG. 5. Universal fixture 600 can be implemented into test assembly 10 in FIG. 1 as universal fixture 30 or 40. Contact points 600 within array 610 are arranged in rows 620 and columns 630. Each row 620 is connected to force selector 540 via lines 640 and sense selector 530 via lines 650. Each column 630 is connected to gate selector 560 via lines 660. To select contact point 500, force selector 540 transmits an electronic signal on line 640 connected to contact point 500, sense selector 530 transmits an electronic signal on line 650 connected to contact point 500 and gate selector 560 transmits an electronic signal on line 660 connected to contact point 500.

Figure 6B:
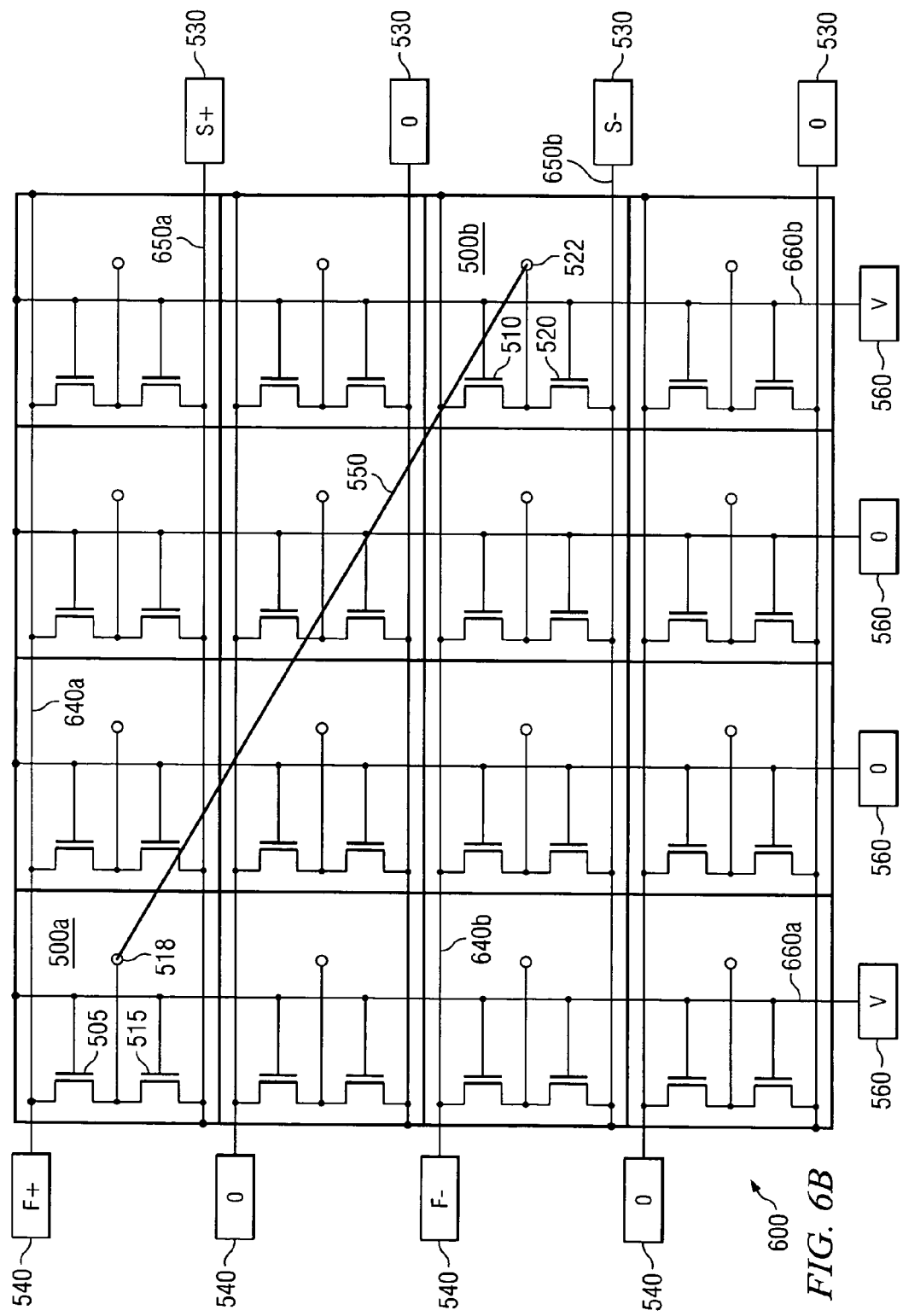
FIG. 6B is a schematic that illustrates the universal fixture of FIG. 6A configured to test a target on an electronic device.

FIG. 6B is a schematic that illustrates the universal fixture of FIG. 6A configured to test a target on an electronic device, such as a bare PCB. Target 550 is connected between contact points 500a and 500b. To select contact point 500a, force selector 540 transmits an electronic signal on line 640a to connect contact point 500a to terminal F+of an external current source via switch 505, sense selector 530 transmits an electronic signal on line 650a to connect contact point 500a to terminal S+ of an external voltmeter via switch 515 and gate selector 560 transmits an electronic signal on line 660a connected to contact point 500a to place switches 505 and 510 in a first state to complete the connection to the current source and voltmeter. To select contact point 500b, force selector 540 transmits an electronic signal on line 640b to connect contact point 500b to terminal F−of an external current source via switch 510, sense selector 530 transmits an electronic signal on line 650b to connect contact point 500b to terminal S− of an external voltmeter via switch 520 and gate selector 560 transmits an electronic signal on line 660b connected to contact point 500a to place switches 510 and 520 in a first state to complete the connection to the current source and voltmeter.

A known current is sourced through target 550 via switches 505 and 510 and conductors 518 and 522. The voltage drop across target 550 is measured via switches 515 and 520 and conductors 518 and 522. The high impedance of the digital voltmeter minimizes the current flow through the voltmeter. Thus, since there is no voltage drop across switches 515 and 520, only the resistance of target 550 is measured. As a result, the resistance of target 550 is equal to the ratio of the measured voltage to the known current. It should be noted that the connections to the target 550 shown in FIG. 6B apply to embodiments where both test points are on the same side of the PCB/DUT. However, in embodiments where the PCB/DUT permits testing of targets (e.g., traces or features) that have test points on opposite sides of the PCB/DUT, two universal fixtures are used, and the PCB/DUT is "sandwiched" between the two universal fixtures, as shown in FIG. 1.

Figure 7:
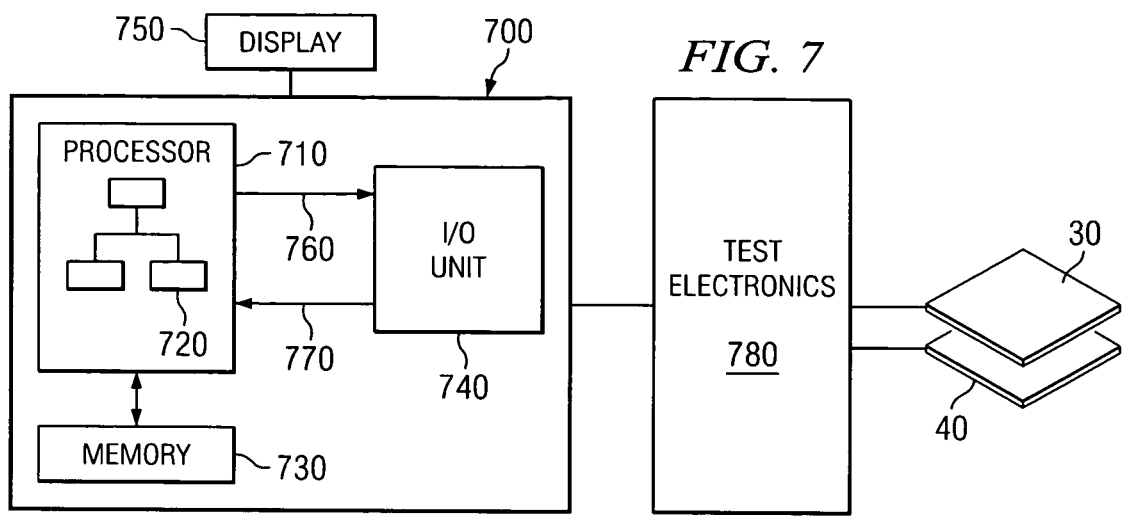
FIG. 7 is a block diagram that illustrates a testing system implementing universal fixtures in accordance with embodiments in accordance with the invention.

FIG. 7 is a block diagram that illustrates a testing system implementing universal fixtures in accordance with embodiments in accordance with the invention. Testing system is designated by reference number 700, and includes processor 710 operable to execute software 720 for testing an electronic device. Processor 710 can be any type of microprocessor, microcontroller, programmable logic device, digital signal processor or other processing device. Processor 710 is coupled to memory unit 730 and input/output (I/O) unit 740. I/O unit 740 can be wired or wireless. Display 750 is optionally coupled to testing system 700 and operable to display testing results to an operator of testing system 700.

In one embodiment in accordance with the invention, processor 710 is operable to execute software 720 to configure universal fixtures 30 and 40 to test a particular electronic device, such as a bare PCB. Processor 710 is capable of taking as input data representing test point locations corresponding to a target on the PCB and mapping the test point locations to a stored representation of contact point locations to determine the contact points on universal fixtures 30 and 40 that are nearest aligned to the test point locations. Processor 710 is further capable of identifying multiple targets to be tested simultaneously by mapping a pattern of test point locations to different, nearest aligned contact points on universal fixtures 30 and 40. To map a pattern of test point locations onto the array of contact points, the state (on or off) of each individual contact point within the array is selected depending on the mapping. For example, an "on" state can be selected for a contact point that has more than ½ of the contact point area covered by a test point in the pattern. Otherwise, an "off" state can be selected for the contact point.

Test information indicating selected contact points for testing one or more targets at each time interval is stored by processor 710 in memory unit 730. Processor 710 communicates with memory unit 730 and I/O unit 740 to transmit test signals 760 containing the test information for each time interval to test electronics 780. Test electronics 780 include contact point selectors, such as selectors 220 and 230 in FIG. 2 or selectors 530, 540 and 560 in FIG. 5, along with any other test equipment, such as a current source, voltmeter or other such test equipment. Test electronics 780 selects contact points on universal fixtures 30 and 40 for testing targets on the PCB based on test signals 760 received from processor 710. Measurements 770 obtained by test electronics 780 are transmitted to processor 710 via I/O unit 740 for subsequent processing and/or display on display 750.

Figure 8:
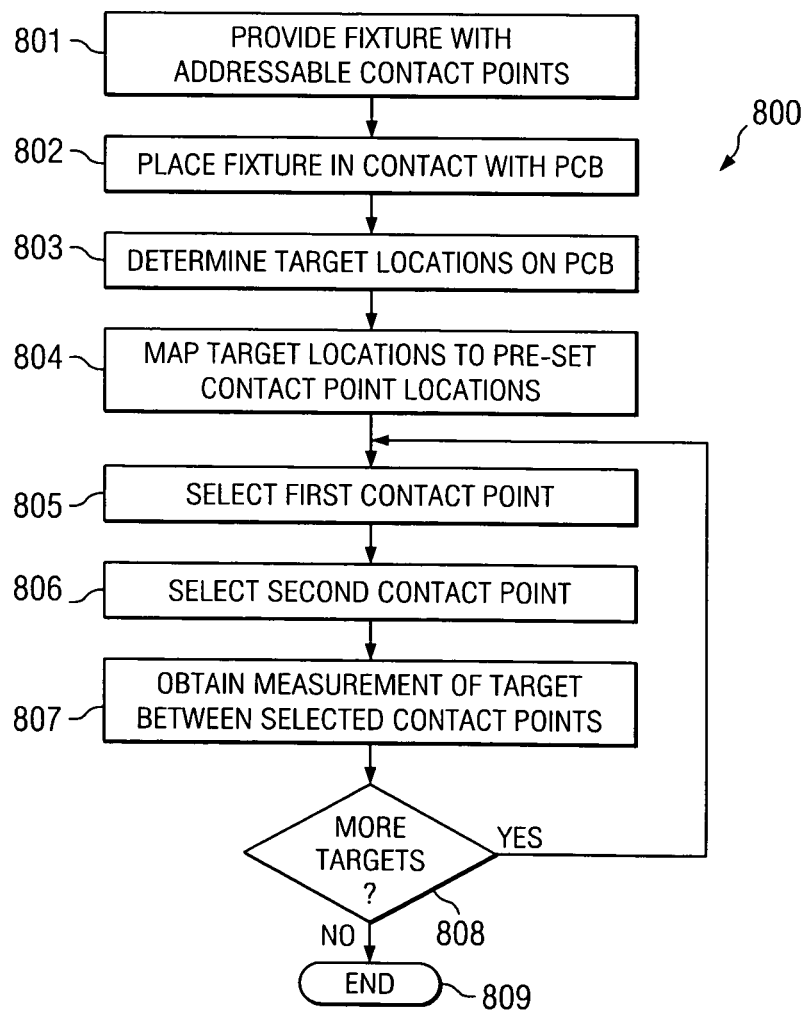
FIG. 8 is a flow chart that illustrates a method for testing an electronic device according to a further exemplary embodiment in accordance with the invention.

FIG. 8 is a flow chart that illustrates a method, generally designated by reference number 800, for testing an electronic device according to a further exemplary embodiment in accordance with the invention. Initially, a universal fixture with an array of randomly addressable contact points, in accordance with embodiments in accordance with the invention, is provided, as shown in step 801. The universal fixture is placed in contact with an electronic device, such as a bare PCB, to test the PCB, as shown in step 802. In steps 803 and 804, test points corresponding to targets on the PCB are determined, and the test points are mapped to contact points on the universal fixture.

Thereafter, as shown in steps 805–807, first and second contact points on the universal fixture that correspond to test points of a particular target on the PCB are selected to obtain a measurement of the target between the first and second selected contact points. If there are additional targets on the PCB to be tested, as shown in step 808, contact points on the universal fixture associated with the additional targets are selected to obtain measurements for the additional targets, as shown in steps 805–807. Otherwise, the process ends at step 809.

The innovative concepts described in the present application can be modified and varied over a wide rage of applications. Accordingly, the scope of patented subject matter should not be limited to any of the specific exemplary teachings discussed, but is instead defined by the following claims.

We claim:

1. A universal fixture for testing an electronic device, comprising:
   a plurality of addressable contact points, each of said contact points including a conductor for creating an electrical connection to said device, and each of said contact points further including a switch connected to said conductor thereof;
   wherein two of said contact points are selected contact points for obtaining a measurement of a target on said device;
   wherein the selection of said selected contact points is configurable based on a position of said target on said device relative to said contact points; and
   wherein a current is sourced through said target via said selected contact points when each said switch in each of said selected contact points is in a same state.

2. The universal fixture according to claim 1, wherein said plurality of addressable contact points are arranged in an array having rows and columns.

3. The universal fixture according to claim 2, wherein the spacing between adjacent ones of said conductors is smaller than the spacing between adjacent targets on said device.

4. The universal fixture according to claim 1, wherein a current is sourced through said target and a voltage is measured across said target when each said switch in each of said selected contact points is in said same state.

5. The universal fixture according to claim 1, wherein said device is a bare printed circuit board.

6. The universal fixture according to claim 1, wherein said universal fixture includes a first universal fixture and a second universal fixture, said device being sandwiched between said first universal fixture and said second universal fixture.

7. The universal fixture according to claim 1, wherein said switch includes at least one thin film transistor.

8. The universal fixture according to claim 1, wherein each said switch of said selected contact points includes a first switch for sourcing a current through said target when said first switch is in said same state and a second switch for measuring a voltage across said target when said second switch is in said same state.

9. A testing system for testing an electronic device, comprising:
   a universal fixture including a plurality of addressable contact points, each of said contact points including a conductor for creating an electrical connection to said device, and each of said contact points further including a switch connected to said conductor thereof; and
   a processor connected to said universal fixture for selecting two of said contact points as selected contact points to obtain a measurement of a target on said device, the selection being based on a position of said target on said device relative to each of said contact points;
   wherein a current is sourced through said target via said selected contact points when each said switch in each of said selected contact points is in a same state.

10. The testing system according to claim 9, wherein said processor is adapted for configuring said universal fixture to simultaneously obtain measurement of multiple targets on said device.

11. The testing system according to claim 9, further comprising:
   a current source connected to source a known current through said target via said selected contact points; and
   a voltmeter connected to measure a voltage across said target via said selected contact points.

12. The testing system according to claim 11, wherein each said switch of said selected contact points includes a first switch for sourcing a current through said target when said first switch is in said same state and a second switch for measuring a voltage across said target when said second switch is in said same state.

13. The testing system according to claim 9, wherein said universal fixture includes a first universal fixture and a second universal fixture, each being connected to said processor, said device being sandwiched between said first universal fixture and said second universal fixture.

14. The testing system according to claim 9, wherein said device is a bare printed circuit board.

15. The testing system according to claim 9, wherein said switch includes at least one thin film transistor.

16. The testing system of claim 9, wherein said plurality of addressable contact points are arranged in an array having rows and columns.

17. The testing system according to claim 16, wherein the spacing between adjacent ones of said conductors is smaller than the spacing between adjacent targets on said device.

18. A method for testing an electronic device, comprising:
   providing a universal fixture including a plurality of addressable contact points, each of said contact points including a switch connected to a conductor that creates an electrical connection to said device;
   selecting two of said contact points as selected contact points to obtain a measurement of a target on said device based on a position of said target on said device relative to said contact points; and
   sourcing current through said target via said selected contact points when each said switch in each of said selected contact points is in a same state.

19. The method according to claim 18, further comprising:
   sourcing said current through said target using a first switch in each of said selected contact points; and
   measuring a voltage across said target using a second switch in each of said selected contact points.

20. The method according to claim 18, wherein said selecting comprises:
   mapping target locations on said device to contact point locations on said universal fixture to select said selected contact points.

21. A universal fixture for testing an electronic device, comprising:
   a plurality of addressable contact points, each of said contact points including for creating an electrical connection to said device, and each of said contact points further including a switch connected to said conductor thereof;
   wherein two of said contact points are selected contact points for obtaining a measurement of a target on said device;
   wherein the selection of said selected contact points is configurable based on a position of said target on said device relative to said contact points; and
   wherein each said switch of said selected contact points includes a first switch for sourcing a current through said target when said first switch is in a first state and a second switch for measuring a voltage across said target when said second switch is in said first state.

22. A method for testing an electronic device, comprising:
   providing a universal fixture including a plurality of addressable contact points, each of said contact points including a switch connected to a conductor that creates an electrical connection to said device;

selecting two of said contact points as selected contact points to obtain a measurement of a target on said device based on a position of said target on said device relative to said contact points;

sourcing a current through said target using a first switch in each of said selected contact points; and measuring a voltage across said target using a second switch in each of said selected contact points.

23. A universal fixture apparatus for testing an electronic device, comprising:

a first universal fixture; and a second universal fixture;

wherein each of said first and second universal fixtures comprises a plurality of addressable contact points, each of said contact points including a conductor for creating an electrical connection to said device, and each of said contact points further including a switch connected to said conductor thereof, wherein two of said contact points of each of said first and second universal fixtures are selected contact points for obtaining a measurement of a target on said device, wherein the selection of said selected contact points is configurable based on a position of said target on said device relative to said contact points, and wherein said first and second universal fixtures are adapted to receive said device sandwiched therebetween.

* * * * *

UNITED STATES PATENT AND TRADEMARK OFFICE
CERTIFICATE OF CORRECTION

| | | |
|---|---|---|
| PATENT NO. | : 7,071,717 B2 | Page 1 of 1 |
| APPLICATION NO. | : 10/975140 | |
| DATED | : July 4, 2006 | |
| INVENTOR(S) | : Hoke et al. | |

It is certified that error appears in the above-identified patent and that said Letters Patent is hereby corrected as shown below:

On the title page, item (56), under U.S. Patent Documents, in column 2, line 11, after "6,597,190" delete "B1" and insert -- B2 --, therefor.

On the title page, item (56), under U.S. Patent Documents, in column 2, line 12, after "6,657,449" delete "B1" and insert -- B2 --, therefor.

On the title page, item (56), under U.S. Patent Documents, in column 2, line 14, after "6,667,630" delete "B1" and insert -- B2 --, therefor.

Signed and Sealed this

Sixth Day of May, 2008

JON W. DUDAS
*Director of the United States Patent and Trademark Office*